(12) United States Patent
Urushihara et al.

(10) Patent No.: US 8,606,205 B2
(45) Date of Patent: Dec. 10, 2013

(54) RECEIVING APPARATUS AND AUTO GAIN CONTROL METHOD

(75) Inventors: Tomoya Urushihara, Kanagawa (JP); Isao Imazeki, Osaka (JP)

(73) Assignee: Panasonic Corporation, Osaka (JP)

( * ) Notice: Subject to any disclaimer, the term of this patent is extended or adjusted under 35 U.S.C. 154(b) by 61 days.

(21) Appl. No.: 13/173,727

(22) Filed: Jun. 30, 2011

(65) Prior Publication Data

US 2012/0001687 A1 Jan. 5, 2012

(30) Foreign Application Priority Data

Jul. 1, 2010 (JP) .................................. 2010-151138

(51) Int. Cl.
*H04B 1/06* (2006.01)
(52) U.S. Cl.
USPC .................. 455/232.1; 455/234.1; 455/234.2; 455/250.1
(58) Field of Classification Search
USPC .............................................. 455/232.1–254
See application file for complete search history.

(56) References Cited

U.S. PATENT DOCUMENTS 7,184,729 B2 * 2/2007 Kluge et al. ................ 455/234.1

FOREIGN PATENT DOCUMENTS

JP 2000-183765 6/2000
JP 2002-290177 10/2002
KR 2007046480 A * 5/2007

OTHER PUBLICATIONS

3GPP TS 25.211 V9.1.0, "3rd Generation Partnership Project; Technical Specification Group Radio Access Network; Physical channels and mapping of transport channels onto physical channels (FDD) (Release 9)," Dec. 2009, pp. 1-58, p. 8, Line 16.
3GPP TS 25.213 V9.1.0, "3rd Generation Partnership Project; Technical Specification Group Radio Access Network; Spreading and modulation (FDD) (Release 9)," Dec. 2009, pp. 1-38, p. 8, Line 18.

* cited by examiner

*Primary Examiner* — Junpeng Chen
(74) *Attorney, Agent, or Firm* — Dickinson Wright PLLC

(57) ABSTRACT

A receiving apparatus converges a gain to a target gain even when a fish bone effect signal is included having a low power period in which signal power decreases abruptly compared to average signal power. The receiving apparatus (100) receives a signal including the fish bone effect signal having the low power period (FBE signal period) in which signal power decreases abruptly compared to average signal power. A FBE detecting section (133) detects an FBE signal period of a low power period based on a gain error corresponding to a difference between target power and average signal power of the received signal of the adjusted gain. Further, the gain error correcting section (134) selects a lower value than 1 as a convergence coefficient in the FBE signal period of a low power period, multiplies the gain error with the selected convergence coefficient and corrects the gain error.

7 Claims, 9 Drawing Sheets

F.I.G.1

RECEIVING APPARATUS AND AUTO GAIN CONTROL METHOD

TECHNICAL FIELD

The present invention relates to a receiving apparatus used in a base station apparatus and a communication terminal apparatus of a mobile communication system, and an auto gain control method.

BACKGROUND ART

Auto gain control (AGC) refers to a technique to make a reception level which varies due to communication distance between a base station apparatus (hereinafter abbreviated as "base station") and a communication terminal apparatus (hereinafter abbreviated as "terminal") or fading stable in order to improve demodulation accuracy.

FIG. 1 is a block diagram of a principal-part configuration of a receiving section of a typical terminal which performs conventional auto gain control. In FIG. 1, receiving section 10 has variable gain amplifying section 11, AD (Analog-to-Digital) converting section 12, AGC control section 13 and demodulating section 14. In addition, for ease of description, in FIG. 1, a frequency converting section that converts a frequency band of a received signal and an IQ demodulating section that extracts signals of I signal and Q signal from received signals are not illustrated.

In FIG. 1, variable gain amplifying section 11 receives an input of a signal received at an antenna, and adjusts the gain of the received signal according to a gain setting value outputted from AGC control section 13. AD conversion section 12 converts the received signal of the adjusted gain, into a digital signal. Demodulating section 14 demodulates the digital signal to acquire received data. AGC control section 13 generates an adequate gain setting value according to the digital signal and target power, and outputs the generated gain setting value to variable gain amplifying section 11.

FIG. 2 is a block diagram illustrating a configuration of AGC control section 13. AGC control section 13 shown in FIG. 2 has signal power detecting section 21, gain error calculating section 22, gain computation value calculating section 23, LPF (Low Pass Filter) 24 and gain setting value storing section 25.

In AGC control section 13 employing the configuration illustrated in FIG. 2, signal power detecting section 21 calculates average signal power of the AD converted digital signal in a predetermined period. Gain error calculating section 22 calculates gain error based on average signal power and target power. Hereinafter, the gain error refers to the difference between a present gain setting value calculated from the magnitude of a received signal (average signal power) and an ideal gain setting value calculated from target power. When units of average signal power and target power are represented by dB, the gain error (dB) is obtained by calculating the difference between average signal power and target power. Gain computation value calculating section 23 calculates a gain computation value based on the gain error and gain setting value outputted from gain setting value storing section 25, and outputs the calculated gain computation value to LPF 24. LPF 24 prevents an abrupt change of gain by applying LPF processing to the gain computation value, and outputs the acquired gain computation value as a gain setting value.

By performing the above operation, AGC control section 13 adjusts a gain setting value according to the magnitude of the received signal. By this means, receiving section 10 can perform adequate signal receiving processing.

Features which this AGC control requires include to improve the accuracy of gain (that is, accuracy of convergence) upon gain convergence, and to reduce the time for gain convergence.

By increasing a time constant of LPF or increasing a gain update cycle, the degree of change of gain becomes small and the gain is followed moderately, so that it is possible to accurately calculate average signal power. Consequently, it is possible to improve the accuracy of convergence of gain. A mode which increases a time constant of LPF or increases a gain update cycle to make the degree of change of gain small and moderately follow gain, is referred to as "tracking mode" or "low speed AGC mode." With the tracking (low speed AGC) mode, a time constant of LFP is increased or gain update cycle is increased, and therefore it takes time until the gain converges.

By contrast, by decreasing the time constant of LPF or decreasing a gain update cycle, a gain can be converged in a shorter time. A mode which can converge a gain quickly in a shorter time is referred to as "pull-in mode" or "high speed AGC mode." With the pull-in (high speed AGC) mode, although it is possible to converge a gain in a shorter period, the gain follows the rapid change of the amplitude of a received signal, and therefore gain convergence accuracy degrades.

Generally, a gain setting with respect to the magnitude of a received signal is out of an adequate state when reception starts. Therefore, when reception starts, the gain convergence time is reduced using the high speed AGC mode. Further, a method is adopted which improves gain convergence accuracy by converging a gain to some extent and then switching to the low speed AGC mode (see, for example, Japanese Patent Application Laid-Open No. 2002-290177).

By the way, signals defined by 3GPP include Fish Bone Effect (FBE) signals. An FBE signal has a period in which instantaneous power of a received signal rapidly becomes smaller than average power (hereinafter "FBE signal period" or "low power period").

Hereinafter, the FBE signal and FBE signal period will be described.

FIG. 3 illustrates a channel configuration of a downlink common channel defined by 3GPP (see 3GPP TS 25.211 V9.1.0 (2009-12) and 3GPP TS 25.213 V9.1.0 (2009-12)). In FIG. 3, P-CPICH (Primary Common Pilot Channel) is a channel utilized for channel estimation, cell search and a timing reference for other downlink physical channels in the same cell in a terminal, and is a channel for transmitting a so-called pilot signal. Further, P-CCPCH (Primary Common Control Physical Channel) is a channel which exists in each cell, and which is used to transmit broadcast information.

As illustrated in FIG. 3, one frame has 15 time slots. The slot length of each time slot is 2560 chips (667 μs). As illustrated in FIG. 3, P-CPICH is used as a reference for other channels.

P-CPICH, the spread factor of P-CCPCH and channelization code No. are each defined as follows.

The spread factor (SF) of P-CPICH is 256, and channelization code No. is 0.

The spread factor (SF) of P-CCPCH is 256, and channelization code No. is 1.

Channelization code No. 0 is a spread code of 1 at all times, and channelization code No. 1 is a spread factor of 1 for the first half of 128 chips and −1 for the second half of 128 chips.

Further, IQ data of P-CPICH is (1, 1) at all times, and IQ data of P-CCPCH is four types of (1, 1), (1, −1), (−1, −1) and (−1, 1).

The base station transmits a downlink common channel in which the above P-CPICH and P-CCPCH are multiplexed. The downlink common channel formed when channel powers of P-CPICH and P-CCPCH are equal is represented as follows.

Downlink common channel=(PCPICH data×channelization code No. 0+PCCPCH data×channelization code No. 1)×scrambling code=downlink common channel signal point×scrambling code According to a combination of the above IQ data and spreading code, the signal point of the downlink common channel adopts one of (2, 2), (2, 0), (0, 2) and (0, 0). Of these signal points, the e rate that (2, 2) is adopted is 25%, the rate that (2, 0) or (0, 2) is adopted is 50% and the rate that (0, 0) is adopted is 25%. Further, of these signals points, (2, 2) has the greatest signal power, (2, 0) or (0, 2) has the second greatest power and (0, 0) has the least signal power.

The signal power of the downlink common channel having these signal points vary according to the following variation pattern.

Variation Pattern [1]:
When the first half of 128 chips of one symbol (256 chips) has signal power [high] (that is, signal point (2, 2)), the second half of chips has signal power [low] (that is, signal point (0, 0)).

Variation Pattern [2]:
When the first half of 128 chips of one symbol (256 chips) has signal power [low] (that is, signal point (0, 0)), the second half of chips has signal power [high] (that is, signal point (2, 2)).

Variation Pattern [3]:
When the first half of 128 chips of one symbol (256 chips) has signal power [middle] (that is, signal point (2, 0) or (0, 2)), the second half of 128 chips also has signal power [middle] (that is, signal point (2, 0) or (0, 2)). That is, signal power [middle] continues in one symbol (256 chips) unit.

Consequently, when signal power varies in the j-th (j is an integer) symbol according to the variation pattern [1] and signal power varies in the (j+1)th symbol continuing to the first symbol in the time domain according to the variation pattern [2], the period of signal power [low] continues for 256 chips.

The period in which signal power [low] continues for 256 chips and the period in which signal power [low] continues for 128 chips according to the variation patterns [1] and [2] are referred to as "FBE signal period." In addition, the FBE signal shows the state of signal power [high] in 128 chips before and after the FBE signal period of continuous 256 chips, and one of 128 chips before and after the FBE signal period of continuous 128 chips, and has characteristics that signal power is higher than average signal power.

FIG. 4 illustrates an example of signal power transition of an FBE signal. As illustrated in FIG. 4, in environment in which only the downlink common channel including P-CPICH and P-CCPCH is transmitted, the FBE signal period in which signal power rapidly becomes low is one symbol (256 chips=66.7 μs) or ½ symbol (128 chips=33.3 μs). This FBE signal period is shorter than a cycle (1 slot=2560 chips=667 μs) defined by a target gain, and the FBE signal period in which signal power rapidly becomes low is longer than a gain update cycle (16.67 μs).

FIG. 5 illustrates how a gain changes when a conventional high speed AGC technique is applied as is to FBE signals having these characteristics. In this case, the AGC control section follows the variation of power in the FBE signal period, and the controlled gain is significantly shifted from the target gain.

Further, if the AGC control section is operated in the low speed mode by, for example, sufficiently increasing a gain update cycle than the FBE signal period to prevent the AGC control section from following power variation in the FBE signal period, the gain does not converge in a required time.

In the high speed mode, a receiving apparatus which receives signals which varies abruptly signal power is disclosed in, for example, Japanese Patent Application Laid-Open No. 2000-183765. The receiving apparatus disclosed in Japanese Patent Application Laid-Open No. 2000-183765 holds a gain when power of the received signal varies abruptly.

PATENT LITERATURE

PTL 1
Japanese Patent Application Laid-Open No. 2002-290177
PTL 2
Japanese Patent Application Laid-Open No. 2000-183765

Non Patent Literature

NPL 1
3GPP TS 25.211 V9.1.0 (2009-12)
NPL 2
3GPP TS 25.213 V9.1.0 (2009-12)

SUMMARY OF INVENTION

Technical Problem

However, the receiving apparatus disclosed in Japanese Patent Application Laid-Open. No. 2000-183765 does not take FBE signals into account, and therefore, if this receiving apparatus is applied as it is to FBE signals having high signal power immediately before the FBE signal period, the controlled gain is shifted from the target gain. Further, the gain is held in a period in which signal power varies, and therefore the gain has difficulty following the gain error which needs to be followed, and the controlled gain is significantly shifted from the target gain.

It is therefore an object of the present invention to provide a receiving apparatus and an auto gain control method which can converge a controlled gain to a target gain even when a fish bone effect signal having a low power period in which signal power decreases abruptly compared to average signal power is included.

Solution to Problem

According to one aspect of the receiving apparatus of the present invention, the receiving apparatus receives a signal including a fish bone effect signal including a low power period in which signal power decreases abruptly compared to average signal power, and has: a variable gain amplifying section that adjusts a gain of a received signal; and an auto gain control section that controls a gain setting value of the variable gain amplifying section according to a gain error corresponding to a difference between target power and average signal power of the received signal after the gain adjustment, wherein the auto gain control section detects the low power period based on the gain error, corrects the gain error in the low power period and sets the gain setting value based on the gain error after the correction.

According to one aspect of the auto gain control method of the present invention receives a signal including a fish bone effect signal including a low power period in which signal power decreases abruptly compared to average signal power, and includes: detecting the low power period based on the gain error corresponding to a difference between target power and average signal power of the received signal after the gain adjustment; correcting the gain error in the low power period; and adjusting a gain of the received signal based on the gain setting for setting the gain setting value based on the gain error after the correction.

Advantageous Effects of Invention

The present invention can converge a gain to a target gain even when a fish bone effect signal having a low power period in which signal power decreases abruptly compared to average signal power is included. Further, the present invention can converge a gain to a target gain even in a low power period.

DESCRIPTION OF EMBODIMENTS

Hereinafter, an embodiment of the present invention will be described in detail with reference to drawings.

Figure 6:
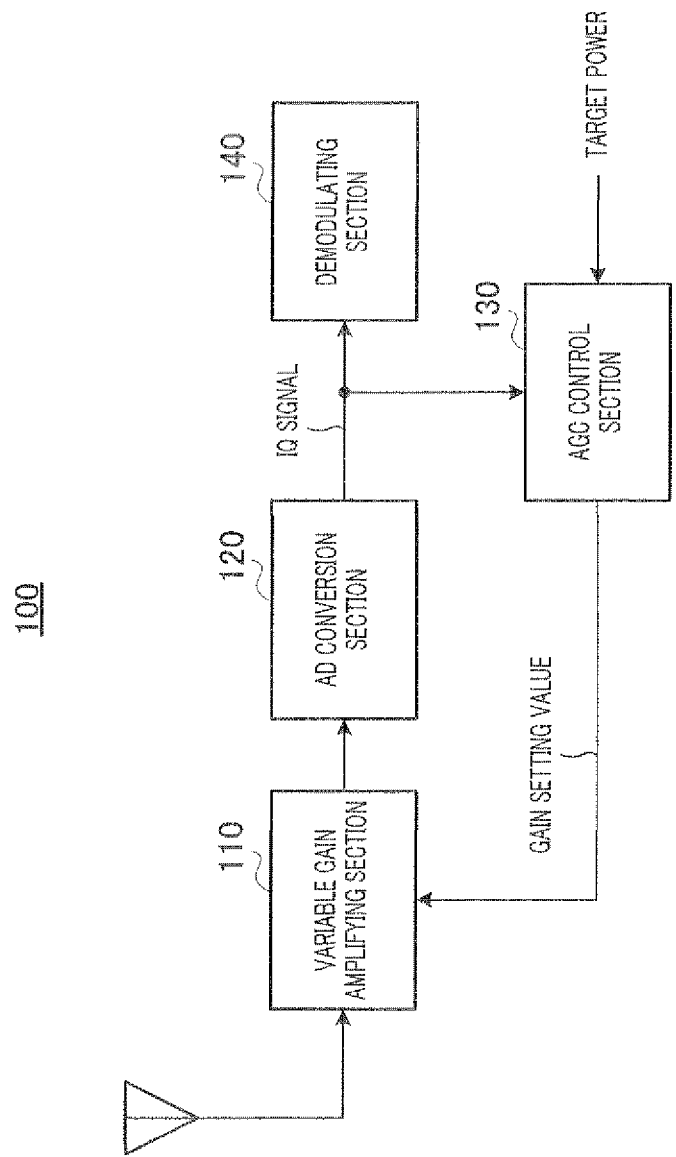
FIG. 6 is a block diagram illustrating a principal-part configuration of a receiving apparatus according to an embodiment of the present invention.

FIG. 6 is a block diagram illustrating a principal-part configuration of a receiving apparatus according to an embodiment of the present invention. Receiving apparatus 100 according to the present embodiment has variable gain amplifying section 110, AD conversion section 120, AGC control section 130 and demodulating section 140. Variable gain amplifying section 110 receives an input of a received signal received at an antenna. Variable gain amplifying section 110 adjusts the gain of the received signal according to a gain setting value outputted from AGC control section 130 which will be described later, and outputs the received signal of the adjusted gain to AD conversion section 120.

AD conversion section 120 converts the received signal of the adjusted gain into a digital signal (IQ signal), and outputs the digital signal to AGC control section 130 and demodulating section 140.

AGC control section 130 calculates the gain setting value of variable gain amplifying section 110 according to a gain error corresponding to the difference between target power and average signal power of the digital signal, and outputs the gain setting value to variable gain amplifying section 110. The inner configuration and operation of AGC control section 130 will be described below.

Demodulating section 140 demodulates the digital signal to acquire received data.

Figure 7:
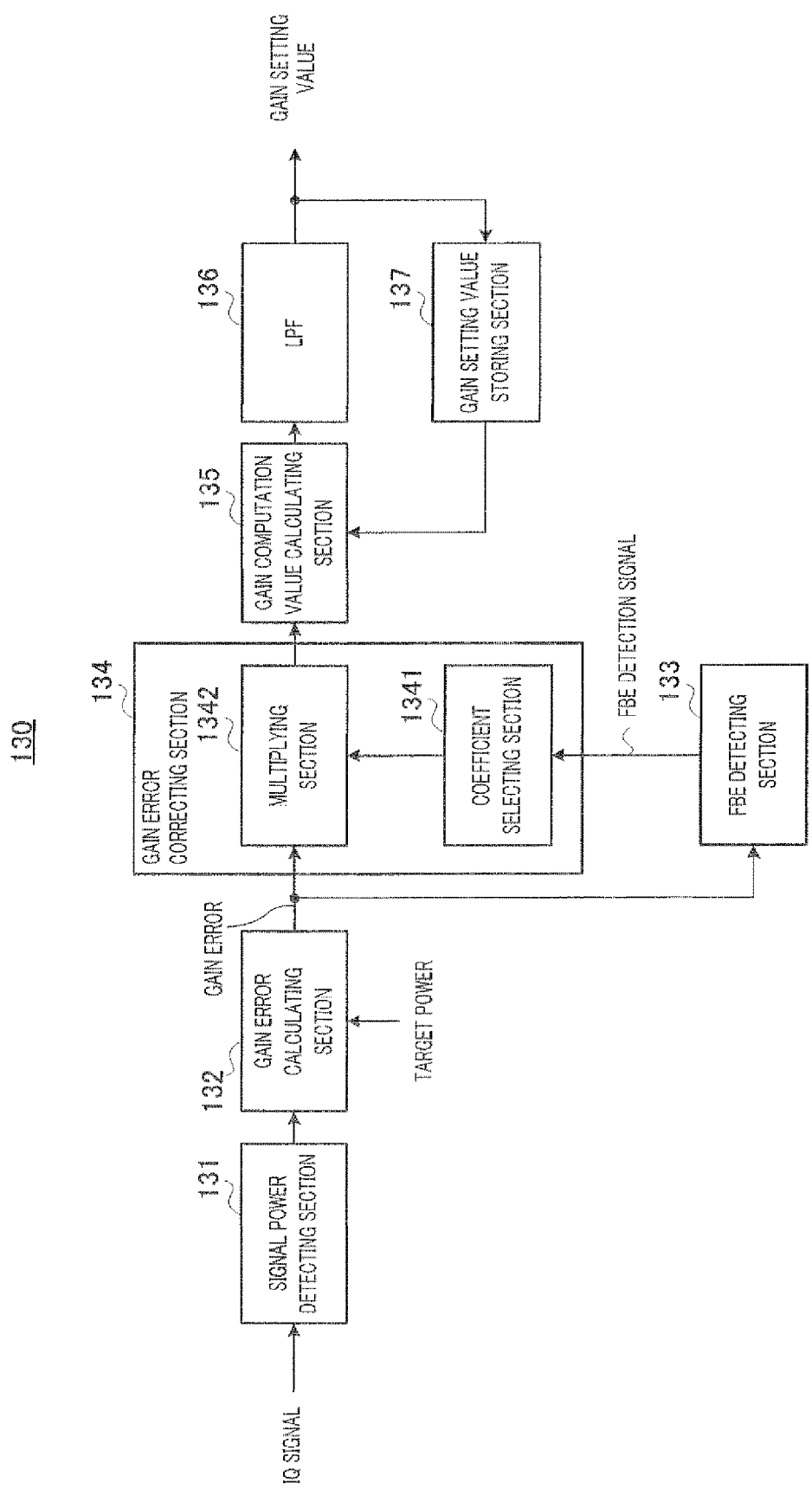
FIG. 7 is a block diagram illustrating an inner configuration of a AGC control section according to the above embodiment.

FIG. 7 is a block diagram illustrating an inner configuration of AGC control section 130 according to the present embodiment. AGC control section 130 of FIG. 7 has signal power detecting section 131, gain error calculating section 132, FBE detecting section 133, gain error correcting section 134, gain computation value calculating section 135, LPF (Low Pass Filter) 136 and gain setting value storing section 137. Signal power detecting section 131 calculates average signal power from the digital signal in a predetermined period, and outputs the calculated average signal power to gain error calculating section 132.

Gain error calculating section 132 calculates the gain error based on average signal power and target power, and outputs the calculated gain error to FBE detecting section 133 and gain error correcting section 134. Hereinafter, the gain error refers to the difference between a present gain setting value calculated from the magnitude of a received signal (average signal power) and an ideal gain setting value calculated from target power; For example, when units of average signal power and target power are represented by dB, gain error calculating section 132 calculates the difference between average signal power and target power as the gain error (dB).

FBE detecting section 133 detects an FBE signal period based on the calculated gain error. In addition, the inner configuration and operation of FBE detection section 133 will be described below. FBE detecting section 133 outputs a FBE detection signal indicating a detection result of the FBE signal period, to gain error correcting section 134.

Gain error correcting section 134 corrects the gain error in the FBE signal period based on the FBE detection signal. Gain error correcting section 134 has coefficient selecting section 1341 and multiplying section 1342.

Coefficient selecting section 1341 selects a convergence coefficient to be multiplied on the gain error, based on the FBE detection signal outputted from FBE detecting section 133. The method of selecting a convergence coefficient in coefficient selecting section 1341 will be described below. Coefficient selecting section 1341 outputs the selected convergence coefficient to multiplying section 1342. Multiplying section 1342 corrects the gain error by multiplying the convergence coefficient with the gain error. Multiplying section 1342 outputs the multiplied gain error to gain computation value calculating section 135.

Gain computation value calculating section 135 calculates a gain computation value based on the multiplied gain error and gain setting value stored in gain setting value storing section 137. Here, the gain computation value is a gain setting value of variable gain amplifying section 110 which needs to be set to compensate for the gain error.

Further, gain computation value calculating section 135 outputs the calculated gain computation value to LPF 136.

LPF 136 smoothes the gain computation value by LPF processing to prevent an abrupt change of the gain, and outputs the gain computation value after LPF processing as a gain setting value.

Gain setting value storing section 137 stores the gain setting value outputted from LPF 136.

Figure 8:
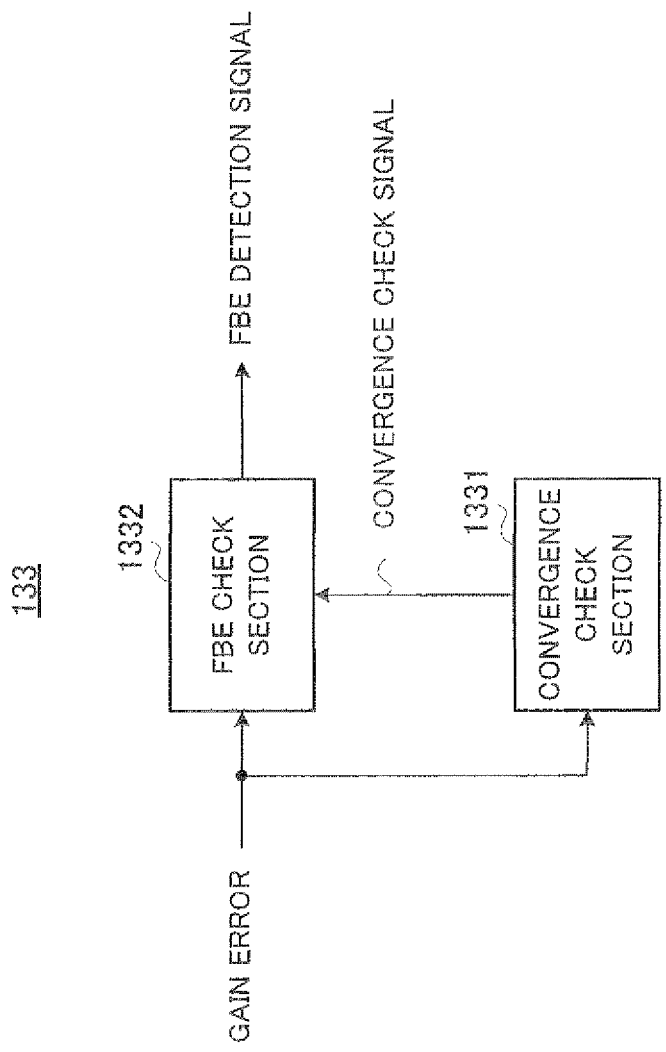
FIG. 8 is a block diagram illustrating an inner configuration of a FBE detecting section according to the above embodiment.

FIG. 8 is a block diagram illustrating an inner configuration of FBE detecting section 133.

FBE detecting section 133 has convergence check section 1331 and FBE check section 1332.

Convergence check section 1331 decides whether or not the gain error has converged within a certain range, based on the gain error calculated in gain error calculating section 132. The decision method in the convergence check section 1331 will be described below. Convergence check section 1331 outputs a convergence check signal based on the decision result, to FBE check section 1332.

FBE check section 1332 detects the FBE signal period according to the convergence check signal and whether a gain error is greater or smaller than a predetermined threshold. More specifically, FBE check section 1332 starts detecting the FBE signal period after the convergence check signal indicates that the gain error converges within a certain range.

According to the method of detecting the FBE signal period, FBE check section 1332, for example, decides that the FBE signal period has already started when the gain error is less than a predetermined threshold, and decides that the FBE signal period ends when the gain error is equal to or more than a predetermined threshold. Further, FBE check section 1332 outputs the decision result of the FBE signal period to gain error correcting section 134.

Next, the operation of AGC control section 130 of receiving apparatus 100 will be described mainly based on operations of FBE detecting section 133 and gain error correcting section 134.

Convergence check section 1331 monitors transition of the gain error, and decides whether the gain error is greater or smaller than a predetermined threshold (hereinafter "convergence check threshold") $Th_{Gain}$. Further, convergence check section 133E decides whether or not the gain has converged, based on the decision result.

For example, when the absolute value of the gain error is less than the convergence check threshold $Th_{Gain}$, convergence check section 1331 decides that the gain has converged to some extent. By contrast, when the absolute value of the gain error is equal to or more than the convergence check value $Th_{Gain}$, convergence check section 1331 decides that the gain has not converged yet.

A specific example of a case where the convergence check threshold $Th_{Gain}$ is 12 dB will be described. When the gain error is 14 dB or −13 dB, convergence check section 1331 decides that the gain has not converged yet. By contrast, when the gain error is 10 dB or −9 dB, convergence check section 1331 decides that the gain has converged.

In addition, when deciding once that the gain is converged, convergence check section 1331 holds the decision result that the gain is converged, until reception of slots is finished or AGC control is started all over again.

By doing this, convergence check section 1331 monitors transition of the gain error, decides whether or not the gain has roughly converged and outputs the convergence check signal indicating the convergence check result, to FBE check section 1332.

FBE check section 1332 receives inputs of the gain error and convergence check signal indicating the convergence check result. When convergence check section 1331 decides that the gain has converged, FBE check section 1332 starts detecting the FBE signal period.

FBE check section 1332 decides whether the gain error is greater or smaller than the predetermined threshold (hereinafter "FBE decision threshold") $Th_{FBE}$, and decides whether or not the FBE signal period has already started, based on the FBE threshold decision result (hereinafter "FBE threshold decision").

When, for example, convergence check section 1331 decides that the gain error is less than FBE decision threshold $Th_{FBE}$, FBE check section 1332 decides that the FBE signal period has already started. In addition, the gain error corresponds to the difference subtracting target power from average power of the received signal (average signal power).

In this case, FBE check section 1332 preferably uses a value lower than a value which is lower by a value corresponding to the difference between signal power [high] and signal power [low], from the upper limit value ($Th_{Gain}$) of the threshold used for decision of convergence.

For example, a case will be described where the difference (hereinafter "maximum power difference") between signal power [high] and signal power [low] is 20 dB. When the convergence check threshold $Th_{Gain}$ is 12 dB, FBE check section 1332 preferably sets as the FBE decision threshold $Th_{FBE}$-10 dB which is lower than −8 dB which is lower the maximum power difference 20 dB than the convergence check value $Th_{Gain}$.

Further, FBE check section 1332 compares the gain error and the FBE decision threshold $Th_{FBE}$, and detects the FBE signal period according to the result of comparison.

When, for example, the gain error is less than the FBE decision threshold $Th_{FBE}$, FBE check section 1332 decides that the FBE signal period has started. Further, when the gain error is equal to or more than the FBE decision threshold $Th_{FBE}$, FBE check section 1332 decides that the FBE signal period has not started.

After detecting the start timing of the FBE signal period, FBE check section 1332 continues deciding whether the gain error is greater or lower than the FBE decision threshold $Th_{EBE}$. Further, when the gain error is less than the FBE decision threshold $Th_{EBE}$, FBE check section 1332 decides that the FBE signal period continues. Further, when the gain error is equal to or more than the FBE decision threshold $Th_{EBE}$, FBE check section 1332 decides that the FBE signal period ends.

A method of detecting an FBE signal period will be described using a specific example.

When the gain error is less than −10 dB (for example, −15 dB), FBE check section 1332 decides that the FBE signal period has started. Further, when the gain error is equal to or more than −10 dB (for example, −9 dB, 8 dB or 13 dB), FBE check section 1332 decides that the FBE signal period has not started. Further, when the gain error is equal to or more than the FBE decision threshold $Th_{FBE}$ (for example, −5 dB) after the timing when the FBE signal period is detected (FBE signal period start timing), FBE check section 1332 decides that the FBE signal period has ended.

In addition, in the case of the downlink common channel of 3GPP, the FBE signal period is 1 symbol long. Therefore, FBE check section 1332 does not perform FBE threshold decision of the gain error in a predetermined period after the FBE signal period is detected, and may resume FBE threshold decision after the FBE signal period is detected and a predetermined period passes. The predetermined period is shorter than 1 symbol long. By this means, it is possible to reduce the amount of computation for detection processing in the FBE signal period.

In this way, FBE detecting section 133 decides whether the gain error is greater or smaller than the FBE decision threshold $Th_{FBE}$, and detects the FBE signal period in which signal power decreases abruptly compared to average signal power and becomes lower power, according to the decision result.

Further, FBE detecting section 133 outputs the FBE detection signal indicating the detection result of the FBE signal period, to gain error correcting section 134.

Gain error correcting section 134 corrects the gain error in the FBE signal period. More specifically, coefficient selecting section 1341 gain error correcting section 134 selects the convergence coefficient to be multiplied on the gain error according to whether or not the FBE signal period has already started, and multiplying section 1342 corrects the gain error by multiplying the gain error with the selected convergence coefficient. Coefficient selecting section 1341 selects a value smaller than 1 (for example, $\frac{1}{16}$) as a predetermined convergence coefficient in the FBE signal period, and selects a normal convergence coefficient (for example, 1) other than in the FBE signal period. By this means, the gain error is corrected to a value having a smaller value than the original gain error.

Gain error correcting section 134 corrects the gain error to smaller value than a normal gain error in the FBE signal period in this way for the following reason.

In the FBE signal period, the gain is temporarily subjected to a rapid decrease (for example, about 20 dB). However, the target gain is set in time slot units (667 μs), and therefore constant value before and after the FBE signal period (66.7 μs). Therefore, if the gain follows the gain error in the FBE signal period as it is, it is difficult to maintain the target gain.

Further, there are cases of the state of signal power [high] immediately before the FBE signal period, the signal power in this period is greater than average signal power. Hence, if the gain setting value is held in the FBE signal period, there are cases where the gain is set to the incorrect value in the EBB signal period.

According to the present embodiment, gain error correcting section 134 multiplies the gain error with a convergence coefficient (for example, $\frac{1}{16}$) smaller than 1 in the FBE signal period, and corrects the gain error to be smaller. Further, gain computation value calculating section 135 sets the gain computation value according to the corrected gain error in the FBE signal period. In this way, with the present embodiment, AGC control section 130 uses a value reflecting the original gain error (corrected gain error). That is, AGC control section 130 does not follow the gain error in the FBE signal period as it is nor holds the gain. By this means, the gain computation value (gain setting value) is also updated even in the FBE signal period. As a result, it is possible to reduce in the FBE signal period the influence due to a power shift in a period in which signal power produced immediately before the FBE signal period is high.

Further, other than in the FBE signal period (normal period), coefficient selecting section 1341 selects as a convergence coefficient a value (for example, 1) greater than the convergence coefficient selected in the FBE signal period. Hence, other than in the FBE signal period, gain computation value calculating section 135 sets the gain computation value to compensate for an actual gain error. As a result, it is possible to quickly correct the gain error other than in the FBE signal period, for example, when reception starts. In this case, a value (for example, $\frac{15}{16}$) smaller than 1 or a value (for example, $\frac{17}{16}$) greater than 1 may be selected as a convergence coefficient. As a result, by selecting a value smaller than 1 as a convergence coefficient, the degree of change of gain becomes small, so that it is possible to improve convergence accuracy of a gain. Further, the degree of change of gain becomes great when a value greater than 1 is selected as a convergence coefficient, so that it is possible to converge a gain quickly even when a gain error is actually detected smaller due to, for example, the range which ADC can detect or the influence of noise.

In this way, with the present embodiment, it is possible to accurately converge the gain to the target gain quickly.

Figure 1:
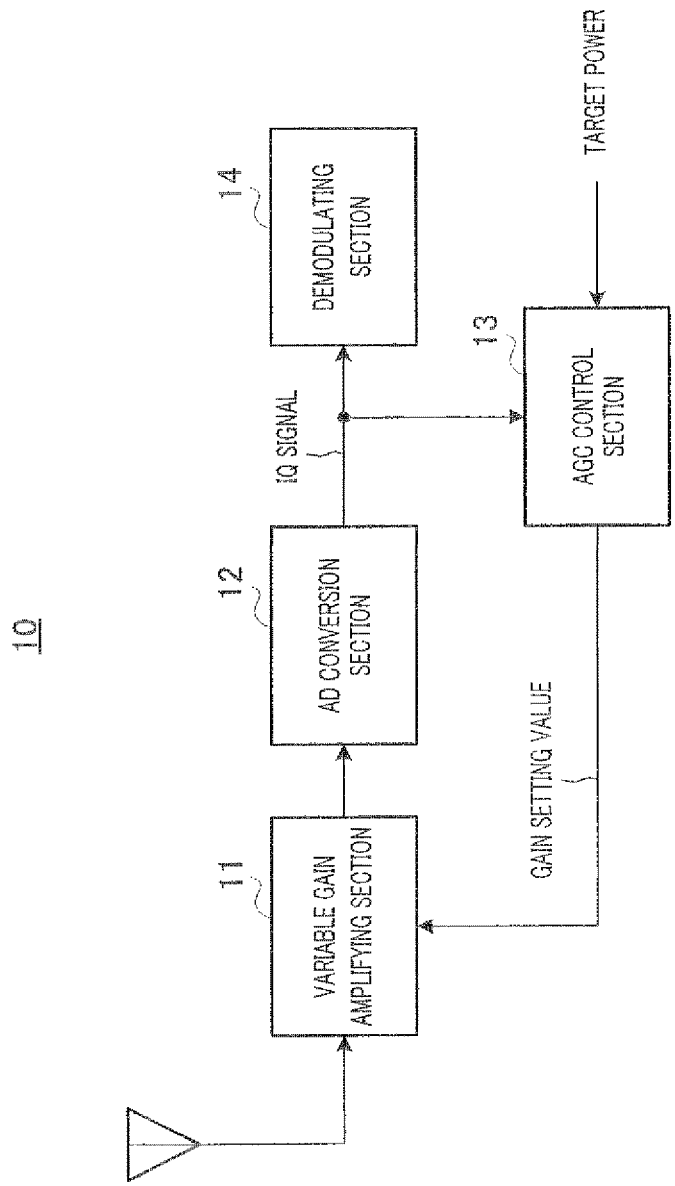
FIG. 1 is a block diagram illustrating a principal-part configuration of a typical terminal which performs conventional AGC.
Figure 2:
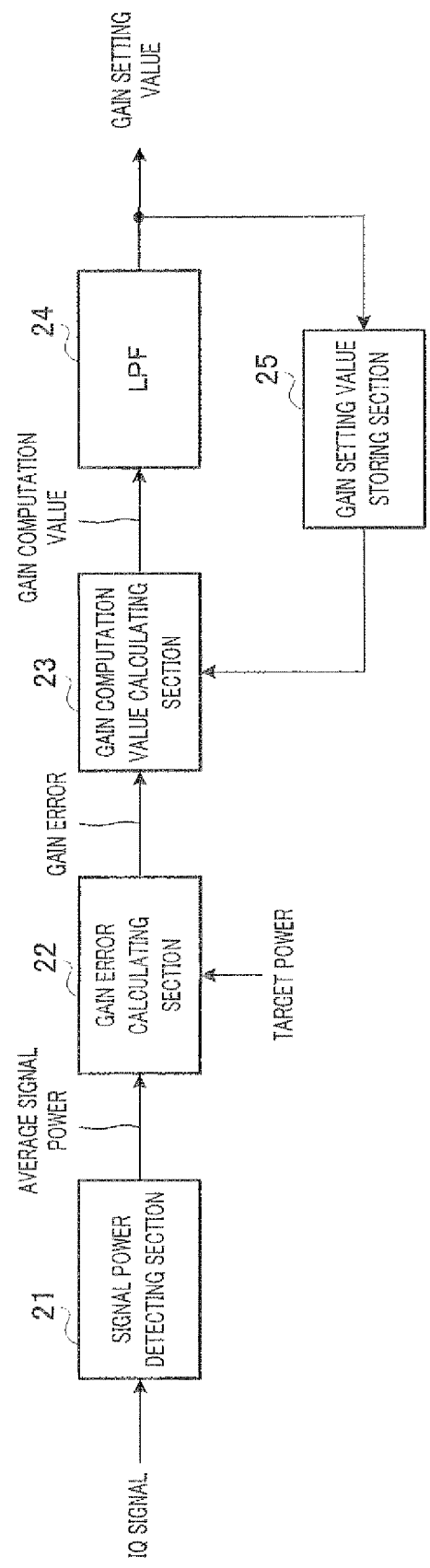
FIG. 2 is a block diagram illustrating an inner configuration of a conventional AGC control section.
Figure 3:
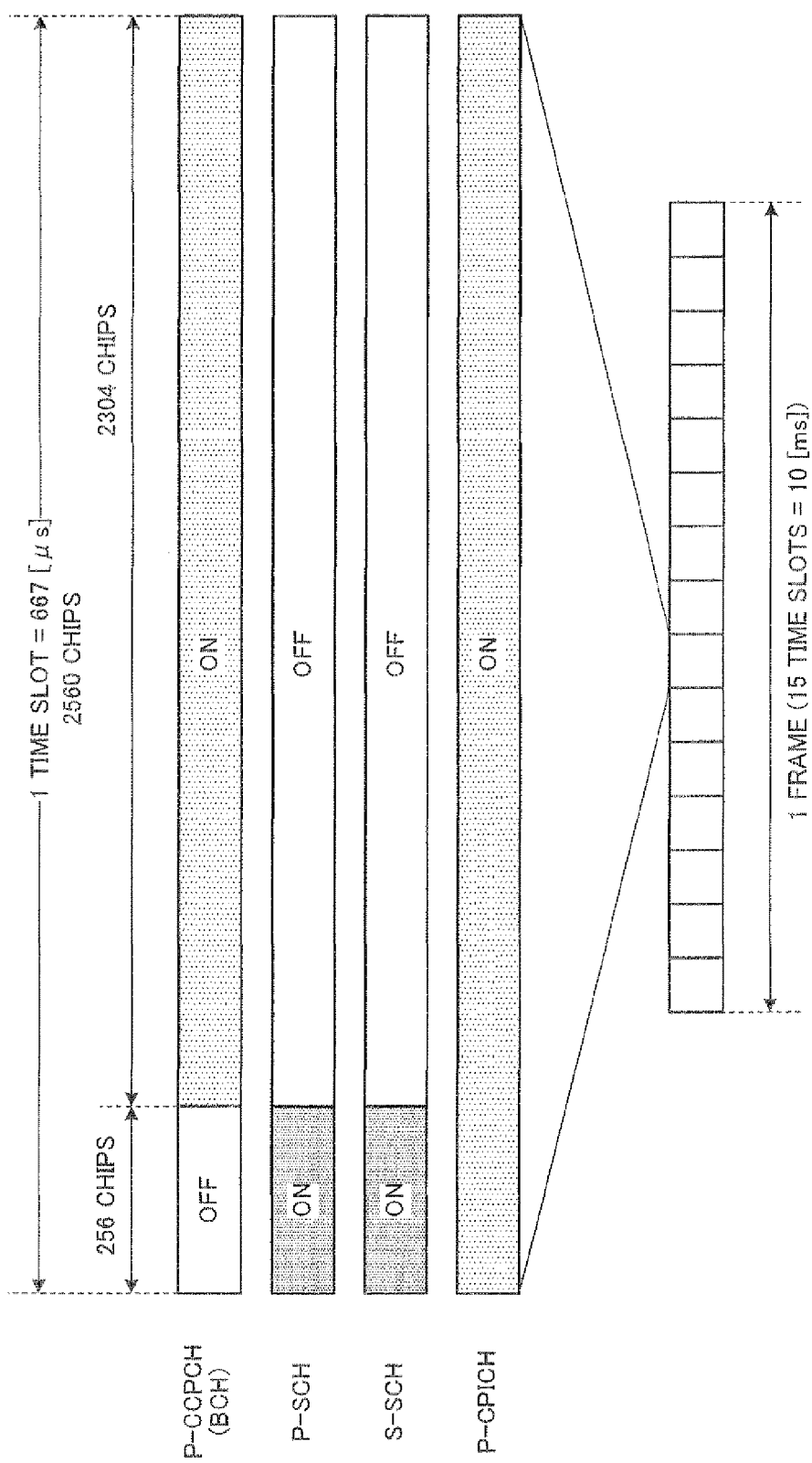
FIG. 3 is a view illustrating a channel configuration of a downlink common channel defined by 3GPP.
Figure 4:
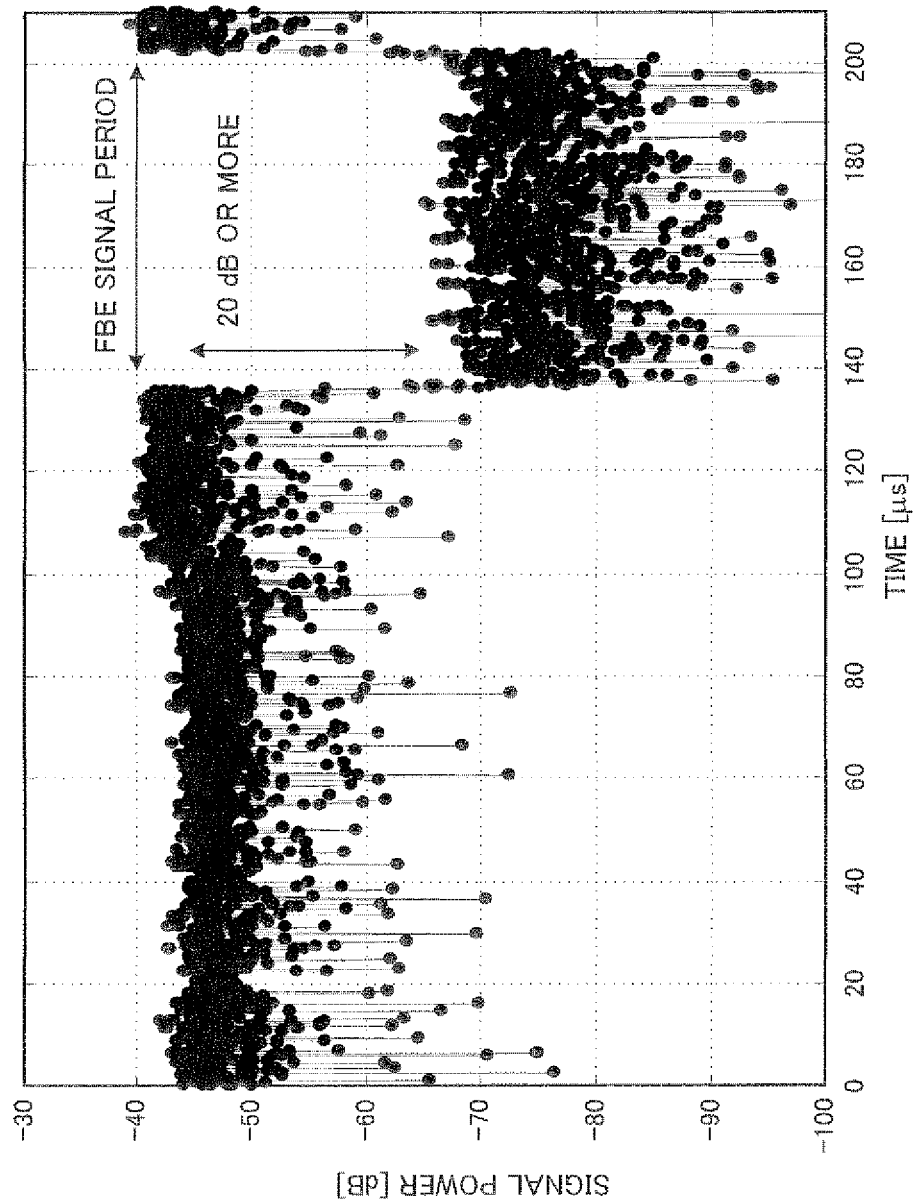
FIG. 4 is a view illustrating an example of signal power transition of an FBE signal.
Figure 5:
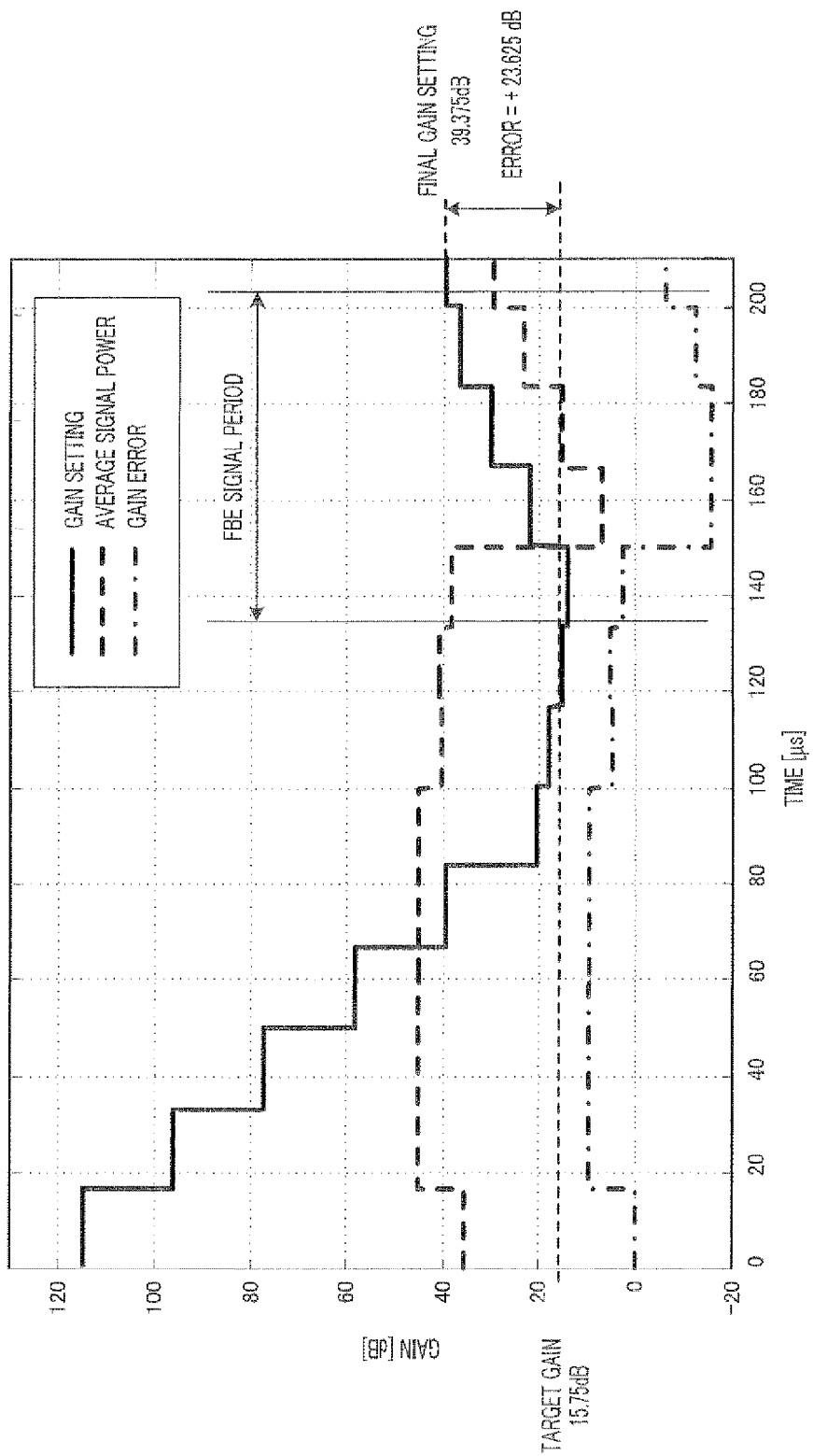
FIG. 5 is a view illustrating how a gain changes when conventional AGC control is applied to an FBE signal.
Figure 9:
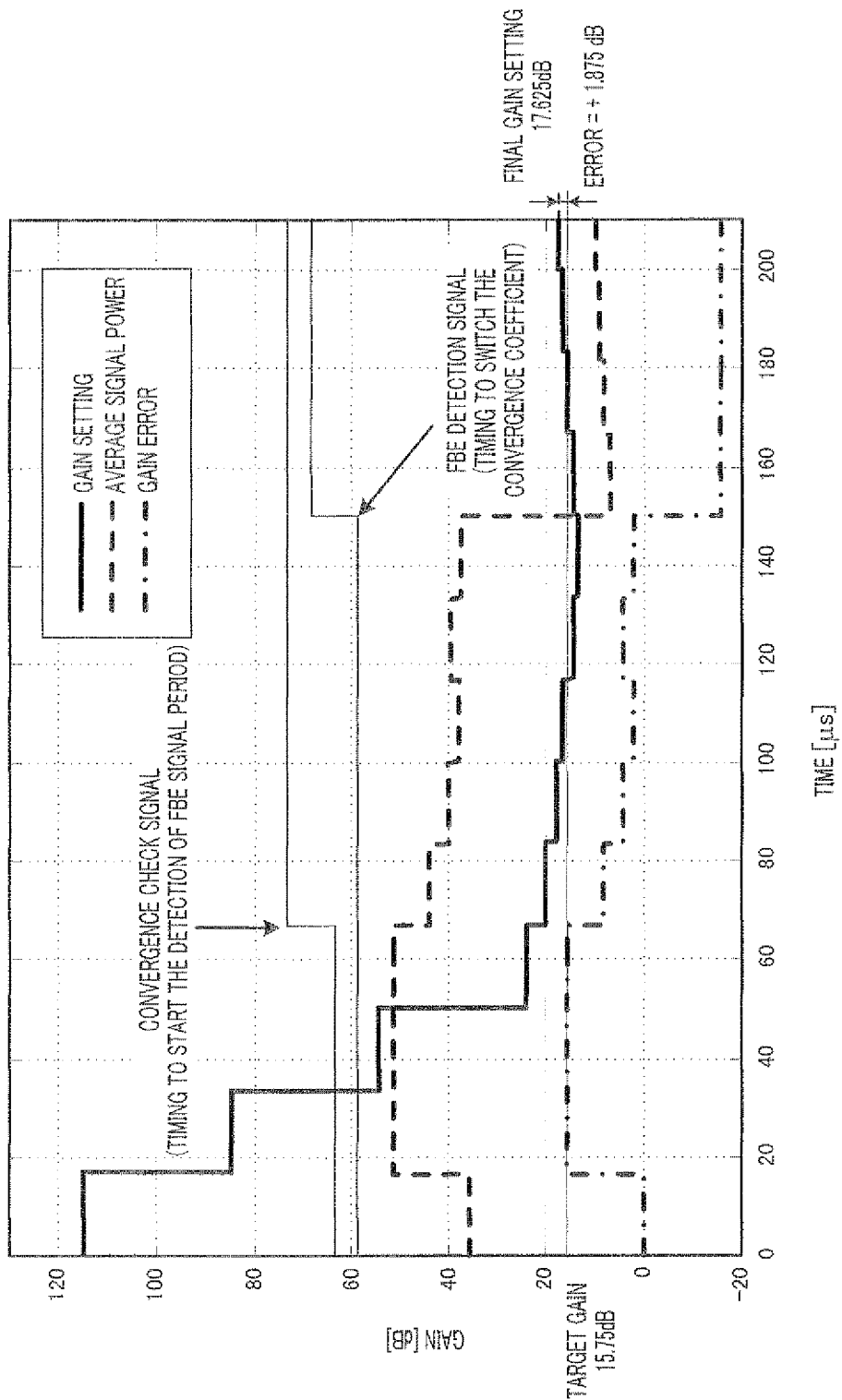
FIG. 9 is a view illustrating how a gain changes when AGC control according to the above embodiment is applied to an FBE signal.

FIG. 9 is a view illustrating how a gain changes when the high speed AGC technique according to present embodiment is applied to an FBE signal having characteristics illustrated in FIG. 4. As described above, in the present embodiment, AGC control section 130 follows a value obtained by reducing the gain error with a constant rate instead of following the gain error (power variation) as it is in the FBE signal period in which signal power decreases abruptly. As a result, as illustrated in FIG. 9, it is possible to suppress the difference between the final gain and target gain (+1.875 dB).

As described above, in the present embodiment, AGC control section 130 detects the FBE signal period of a low power period based on the gain error, corrects the gain error in the FBE signal period and sets the gain setting value based on the corrected gain error. More specifically, AGC control section 130 has FBE detecting section 133 and gain error correcting section 134. Further, FBE detecting section 133 detects the FBE signal period of a low power period based on the gain error corresponding to the difference between target power and average signal power of a received signal of the adjusted gain. Further, gain error correcting section 134 selects a lower value than 1 as a convergence coefficient in the FBE signal period of a low power period, multiplies the gain error with the selected convergence coefficient and corrects the gain error.

By this means, other than in, for example, the FBE signal period, for example, when reception starts, AGC control section 130 can quickly correct the gain error. Further, also in the FBE signal period, AGC control section 130 can reduce the influence due to the gain error produced in the period. As a result, it is possible to accurately converge a gain to the target gain quickly.

INDUSTRIAL APPLICABILITY

The receiving apparatus and auto gain control method according to the present invention are useful for, for example, receiving apparatuses in mobile telephones. Further, the receiving apparatus and auto gain control method are applicable for use in other receiving apparatuses employing wireless communication.

REFERENCE SIGNS LIST

100 RECEIVING APPARATUS
110 VARIABLE GAIN AMPLIFYING SECTION
120 AD CONVERSION SECTION
130 AGC CONTROL SECTION
131 SIGNAL POWER DETECTING SECTION
132 GAIN ERROR CALCULATING SECTION
33 FBE DETECTING SECTION
1331 CONVERGENCE CHECK SECTION
1332 FBE CHECK SECTION
134 GAIN ERROR CORRECTING SECTION
1341 COEFFICIENT SELECTING SECTION
1342 MULTIPLYING SECTION
135 GAIN COMPUTATION VALUE CALCULATING SECTION
136 LPF
137 GAIN SETTING VALUE STORING SECTION
140 DEMODULATING SECTION
100 RECEIVING APPARATUS

110 VARIABLE GAIN AMPLIFYING SECTION
120 AD CONVERSION SECTION
130 AGC CONTROL SECTION
131 SIGNAL POWER DETECTING SECTION
132 GAIN ERROR CALCULATING SECTION
133 FBE DETECTING SECTION
1331 CONVERGENCE CHECK SECTION
1332 FBE CHECK SECTION
134 GAIN ERROR CORRECTING SECTION
1341 COEFFICIENT SELECTING SECTION
1342 MULTIPLYING SECTION
135 GAIN COMPUTATION VALUE CALCULATING SECTION
136 LPF
137 GAIN SETTING VALUE STORING SECTION
140 DEMODULATING SECTION

The invention claimed is:

1. A receiving apparatus which receives a signal including a fish bone effect signal comprising a low power period in which signal power decreases abruptly compared to average signal power, the receiving apparatus comprising:
   a variable gain amplifying section that adjusts a gain of a received signal; and
   an auto gain control section that calculates a gain setting value to be outputted to the variable gain amplifying section according to a gain error, the gain error being calculated based on target power and average signal power of the received signal after the gain adjustment,
   wherein the auto gain control section detects the low power period based on the gain error, corrects the gain error in the low power period and sets the gain setting value based on the gain error after the correction.

2. The receiving apparatus according to claim 1, wherein the auto gain control section comprises:
   a signal power detecting section that calculates the average signal power;
   a gain error calculating section that calculates the gain error based on the target power and the average signal power;
   a period detecting section that detects the low power period based on the gain error; and
   a correcting section that selects a convergence coefficient to be multiplied on the gain error according to a detection result of the period detecting section, and multiplies the gain error with the selected convergence coefficient,
   wherein the gain setting value is set based on the gain error after the multiplication.

3. The receiving apparatus according to claim 2, wherein the correcting section selects a lower value than 1 as the convergence coefficient in the low power period, and selects as the convergence coefficient a value greater than a value of the convergence coefficient selected in the low power period.

4. The receiving apparatus according to claim 2, comprising:
   a convergence check section that decides whether or not the gain error has converged within a certain range, and outputs a convergence check signal indicating a decision result; and
   a fish bone effect check section that detects the low power period according to the convergence check signal and whether the gain error is greater or smaller than a predetermined threshold.

5. The receiving apparatus according to claim 4, wherein the fish bone effect check section starts detecting the low power period after the gain error converges to a certain range.

6. The receiving apparatus according to claim 1, wherein the received signal is a downlink common channel according to a third generation partnership project.

7. An auto gain control method in a receiving apparatus which receives a signal including a fish bone effect signal comprising a low power period in which signal power decreases abruptly compared to average signal power, the auto gain control method comprising:
   detecting the low power period based on a gain error, the gain error being calculated based on target power and average signal power of a received signal after gain adjustment;
   correcting the gain error in the low power period; and
   adjusting a gain of the received signal based on the gain setting value based on the gain error after the correction.

* * * * *